United States Patent
Lee et al.

(10) Patent No.: US 11,664,779 B2
(45) Date of Patent: May 30, 2023

(54) ACOUSTIC IMPEDANCE MATCHING WITH BUBBLE RESONATORS

(71) Applicant: Toyota Motor Engineering & Manufacturing North America, Inc., Plano, TX (US)

(72) Inventors: Taehwa Lee, Ann Arbor, MI (US); Hideo Iizuka, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 937 days.

(21) Appl. No.: 16/502,960

(22) Filed: Jul. 3, 2019

(65) Prior Publication Data

US 2021/0006222 A1    Jan. 7, 2021

(51) Int. Cl.
  *H03H 9/00*   (2006.01)
  *H03H 9/24*   (2006.01)

(52) U.S. Cl.
  CPC ............ *H03H 9/0004* (2013.01); *H03H 9/24* (2013.01)

(58) Field of Classification Search
  CPC .... H03H 9/0004; H03H 9/0009; H03H 9/145; H03H 9/24; H03H 7/38; H03H 2007/386; G10K 11/00; G10K 11/002; G10K 11/02
  See application file for complete search history.

(56) References Cited

U.S. PATENT DOCUMENTS

| | | | |
|---|---|---|---|
| 3,674,945 A * | 7/1972 | Hands | G10K 11/02 381/337 |
| 6,307,302 B1 | 10/2001 | Toda | |
| 6,390,985 B1 * | 5/2002 | Mamayek | G10K 11/02 310/336 |
| 6,545,947 B1 | 4/2003 | Morozumi et al. | |
| 6,969,943 B2 * | 11/2005 | Hashimoto | G10K 11/02 310/334 |

(Continued)

FOREIGN PATENT DOCUMENTS

| | | |
|---|---|---|
| EP | 1600031 B1 | 11/2005 |
| GB | 2552780 A | 2/2018 |
| WO | 2015152438 A1 | 10/2015 |

OTHER PUBLICATIONS

Bok et al., "Metasurface for Water-to-Air Sound Transmission", Physical Review Letters, Jan. 26, 2018 (6 pages).

*Primary Examiner* — Quochien B Vuong
(74) *Attorney, Agent, or Firm* — Christopher G Darrow; Darrow Mustafa PC

(57) ABSTRACT

An acoustic impedance matching device can facilitate acoustic transmission across an interface formed by materials having a very large acoustic impedance mismatch (e.g. air-water, or air-elastic polymer). The device can include a first medium. The first medium can have a first acoustic impedance. The device can include a second medium. The second medium can have a second acoustic impedance. The second acoustic impedance can be substantially greater than the first acoustic impedance. Thus, the first acoustic impedance and the second acoustic impedance are substantially mismatched. An interface can be defined between the first medium and the second medium. A bubble can be located in the second medium or the interface. The bubble can act as a resonator and can enable efficient sound transmission despite the large impedance mismatch of the first medium and the second medium.

20 Claims, 6 Drawing Sheets

(56) References Cited

U.S. PATENT DOCUMENTS

| | | | | |
|---|---|---|---|---|
| 6,989,625 B2 * | 1/2006 | Suzuki | .................... | G01F 1/662 |
| | | | | 310/334 |
| 7,389,569 B2 | 6/2008 | Shiraishi et al. | | |
| 10,771,892 B1 * | 9/2020 | Morozov | ................. | G10K 9/22 |
| 2019/0035374 A1 | 1/2019 | Martin et al. | | |

* cited by examiner

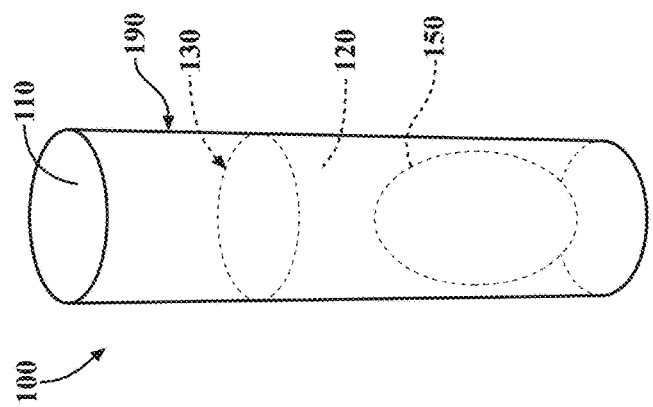
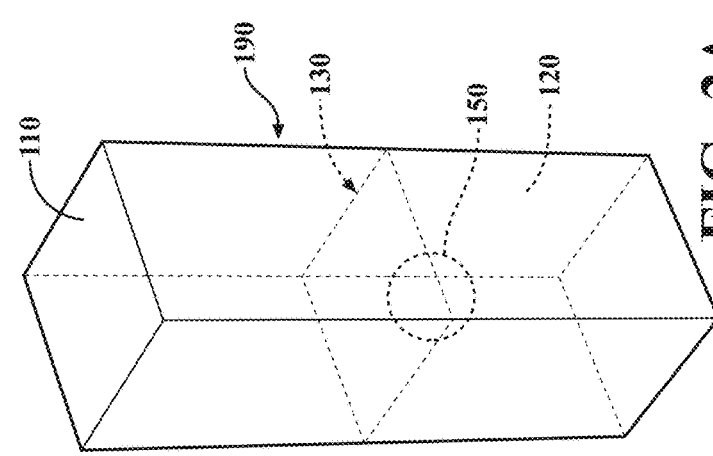
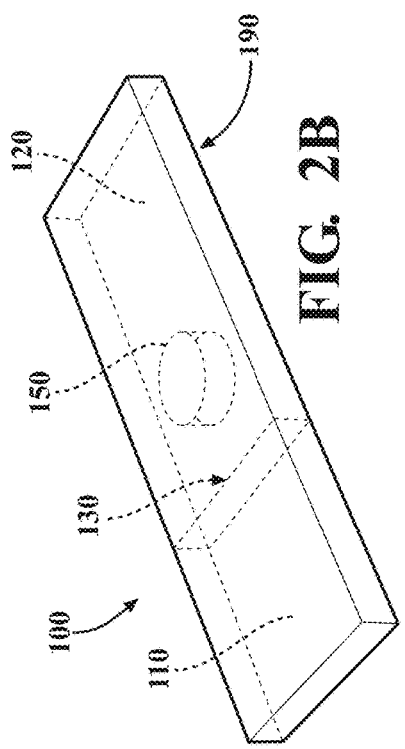
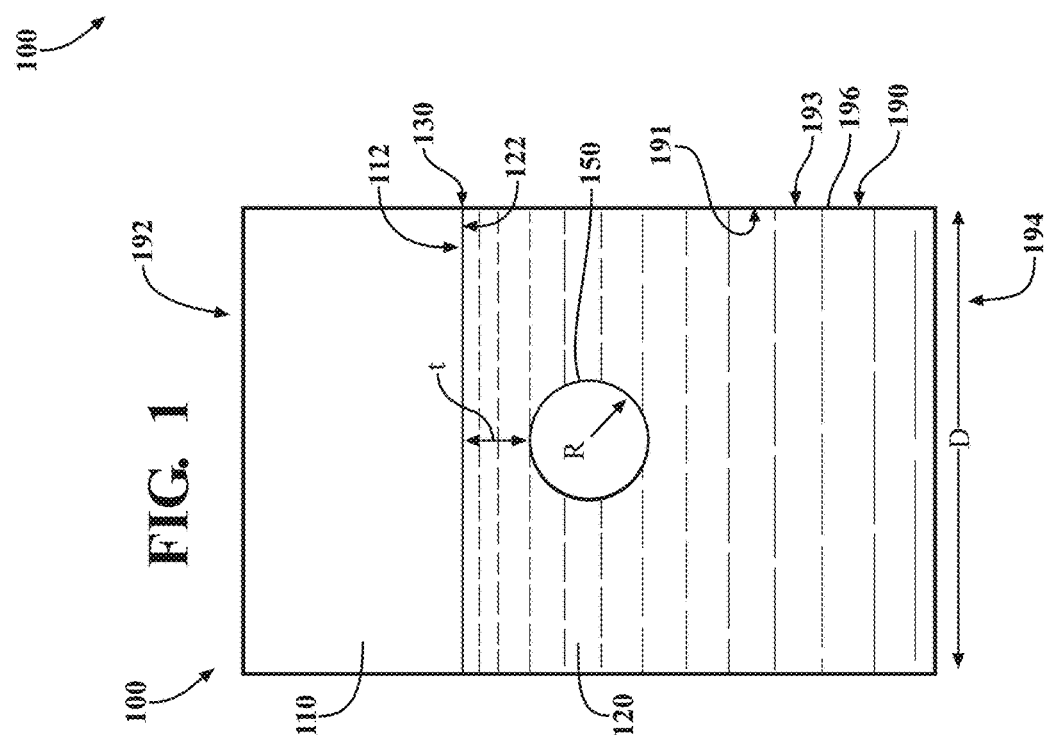

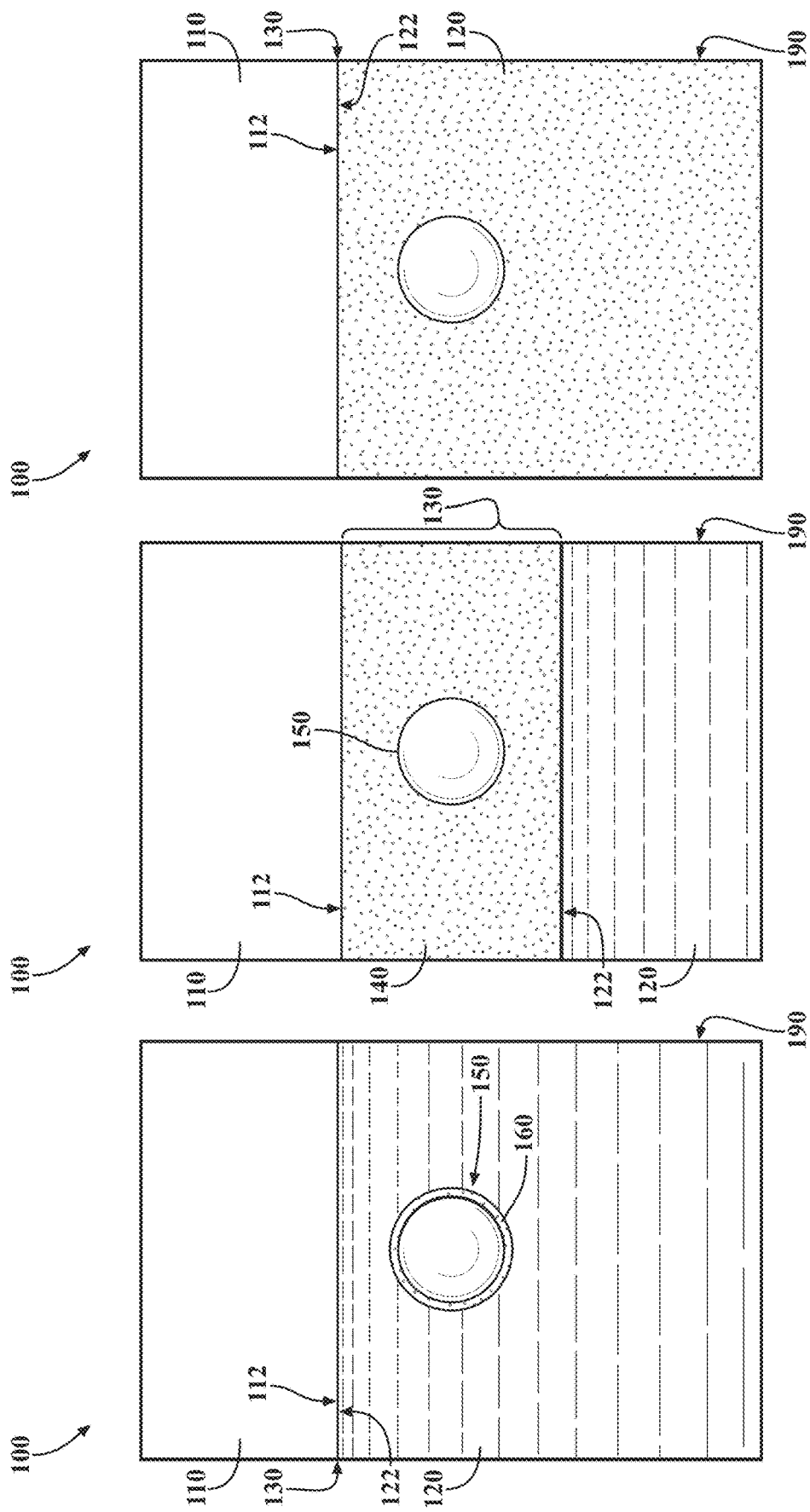

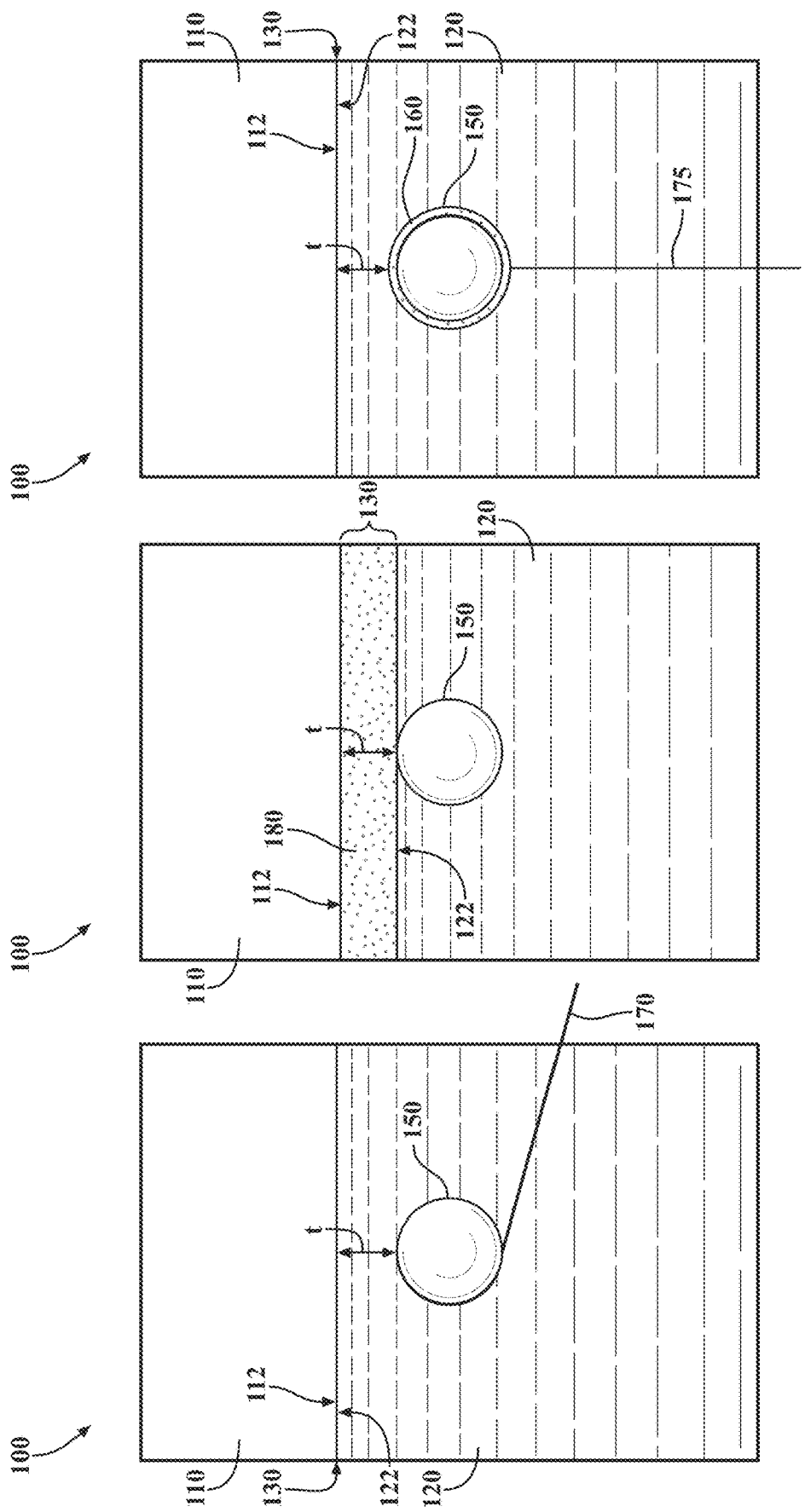

ACOUSTIC IMPEDANCE MATCHING WITH BUBBLE RESONATORS

FIELD

The subject matter described herein relates in general to interfaces between different materials and, more particularly, to acoustic transmission across interfaces between different materials with a large acoustic impedance mismatch.

BACKGROUND

In many applications, there are interfaces formed between different materials. When there is a large acoustic impedance mismatch between these materials, acoustic signals encountering the interface can be reflected. Thus, only a limited amount of acoustic wave transmission across the interface may occur, especially for large impedance mismatches (e.g. between air and solid, or between gas and liquid). Quarter wavelength impedance matching layers can be used to facilitate transmission across the interface.

SUMMARY

In one respect, the present disclosure is directed to an acoustic impedance matching device. The device includes a first medium. The first medium can have a first acoustic impedance. The device can include a second medium. The second medium can have a second acoustic impedance. The second acoustic impedance can be substantially greater than the first acoustic impedance. Thus, the first acoustic impedance and the second acoustic impedance are substantially mismatched. An interface can be defined between the first medium and the second medium. A bubble can be defined within the second medium or the interface.

In another respect, the present disclosure is directed to an acoustic impedance matching system. The system can include an array of a plurality of acoustic impedance matching devices. Each device can include a first medium. The first medium can have a first acoustic impedance. Each device can include a second medium. The second medium can have a second acoustic impedance. The second acoustic impedance can be substantially greater than the first acoustic impedance. Thus, the first acoustic impedance and the second acoustic impedance are substantially mismatched. An interface can be defined between the first medium and the second medium. A bubble can be defined within the second medium or the interface.

BRIEF DESCRIPTION OF THE DRAWINGS

FIG. 1 is an example of an acoustic impedance matching device.

FIGS. 2A-2C are examples of various acoustic impedance matching devices with different container and bubble shapes.

FIG. 3A-3C are examples of an acoustic impedance matching devices, showing various ways for defining a bubble.

FIGS. 4A-4C are examples of ways for maintaining a bubble at a distance from an interface.

DETAILED DESCRIPTION

Figure 5:
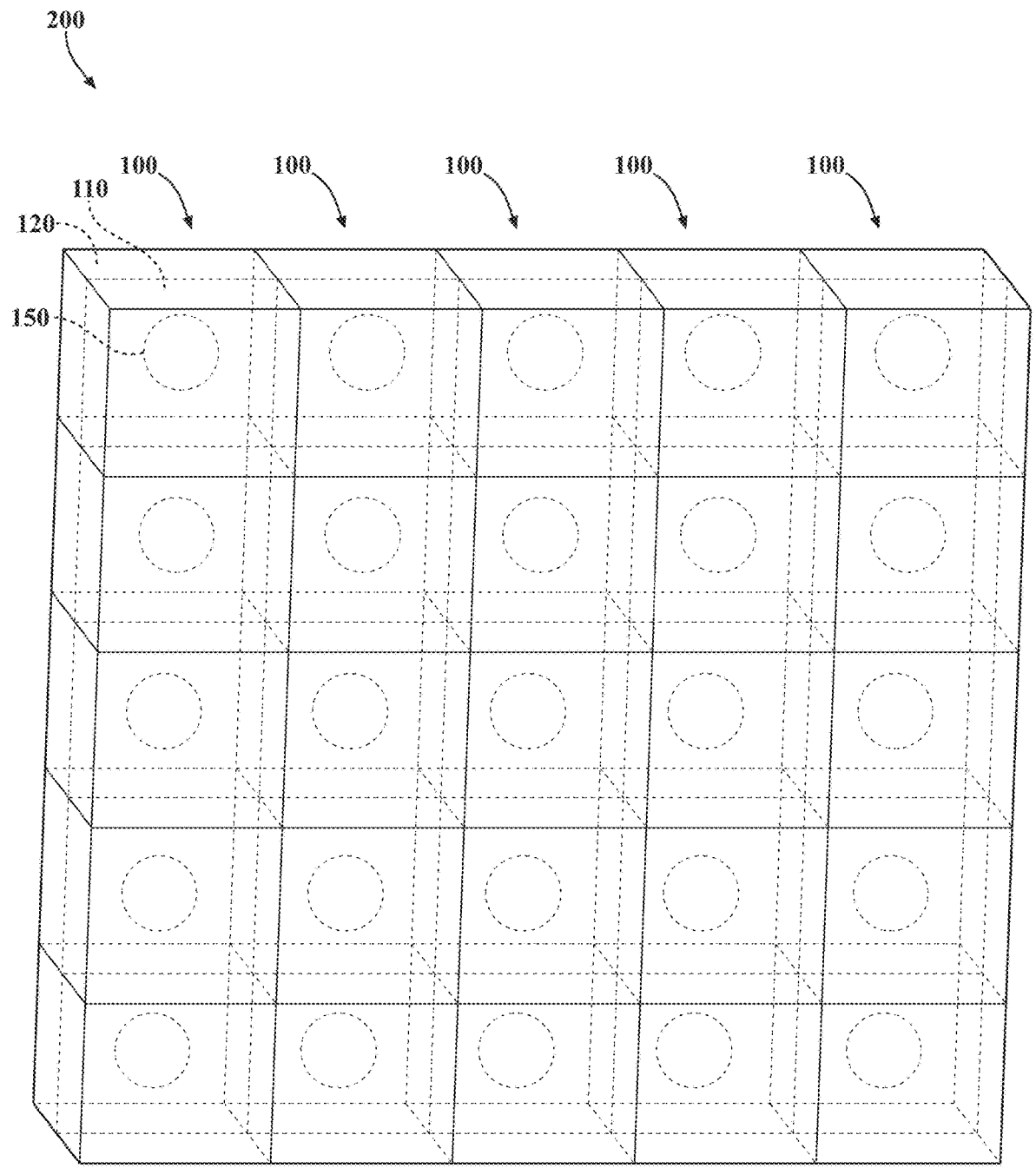
FIG. 5 is an example of an acoustic impedance matching system that includes a plurality of acoustic impedance matching devices.

Quarter wavelength matching layers can be effective in the case of small acoustic impedance mismatches at an interface. However, they are not suitable for large acoustic impedance mismatches. Also, quarter wavelength impedance matching layers are typically very thick for low frequency operation. Accordingly, arrangements described herein are directed to acoustic impedance matching devices, systems, and/or methods for facilitating acoustic transmission across an interface formed by materials having a very large acoustic impedance mismatch, such with air-water or air-elastic polymer material interfaces. An acoustic impedance matching device can include a bubble. The bubble can be located near or within an interface between the first medium and the second medium. The bubble can act as a resonator, enabling efficient acoustic signal or wave transmission across the interface despite the large impedance mismatch between the materials forming the interface.

Detailed embodiments are disclosed herein; however, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-7B, but the embodiments are not limited to the illustrated structure or application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details.

FIG. 1 is an example of an acoustic impedance matching device 100. The acoustic impedance matching device 100 can be configured to facilitate acoustic transmission across an interface formed by materials having a very large acoustic impedance mismatch. The acoustic impedance matching device 100 can include a first medium 110 and a second medium 120 located within a container 190.

The first medium 110 can be any suitable material. In one or more arrangements, the first medium 110 can be air. The first medium 110 can be in any state of matter. In one or more arrangements, the first medium 110 can be a gas. The first medium 110 can have an associated acoustic impedance.

The second medium 120 can be any suitable material. In one or more arrangements, the second medium 120 can be water or an elastic material. The second medium 120 can be in any state of matter. In one or more arrangements, the second medium 120 can be a solid or a liquid. The second medium 120 can have an associated acoustic impedance.

The acoustic impedance of the second medium 120 can be substantially greater than the acoustic impedance of the first medium 110. In this context, "substantially greater" means at least about 10 times greater. In some arrangements, "substantially greater" can mean at least about 100 times greater, at least about 500 times greater, at least about 1000 times greater, at least about 2000 times greater, at least about 3000 times greater, at least about 4000 times greater, at least about 5000 times greater, at least about 6000 times greater, at least about 7000 times greater, at least about 8000 times greater, at least about 9000 times greater, at least about 10,000 times greater, or even greater. Thus, when the acoustic impedance of one of the mediums is substantially greater than the other medium, the acoustic impedances can be said to be substantially mismatched.

An interface 130 can be defined between the first medium 110 and the second medium 120. The first medium 110 can have an interface-facing portion 112, and the second medium 120 can have an interface-facing portion 122. The interface 130 can be defined in any suitable manner. In one or more arrangements, the interface 130 can be defined by the directly contacting portions of the first medium 110 and the second medium 120. The interface 130 can be a region or a plane. In one or more arrangements, as will be described later, there can be an intermediate layer 140 (FIG. 3B) or spacing layer 180 (FIG. 4B) separating the first medium 110 and the second medium 120. In such case, the interface 130 can be at least partially defined by the intermediate layer 140/the spacing layer 180, the interface-facing portion 112 of the first medium 110, the interface-facing portion 122 of the second medium 120, and/or any combination or subset thereof.

In one or more arrangements, the first medium 110 can be air, and the second medium 120 can be water. In one or more arrangements, the first medium 110 can be air, and the second medium 120 can be an elastic polymer. In one or more arrangements, the first medium 110 can be a gas, and the second medium 120 can be a solid or a liquid.

The acoustic impedance matching device 100 can include a bubble 150. In some arrangements, acoustic impedance matching device 100 can include a single bubble 150. The bubble 150 can act as a resonator, which can enable efficient sound transmission despite the large impedance mismatch between the first medium 110 and the second medium 120.

The bubble 150 can be a defined in various ways. In one or more arrangements, the bubble 150 can be defined by a void in a medium, such as in a liquid or solid medium. As another example, the bubble 150 can be defined by a shell 160 (FIG. 3A) or film enclosing a space. The shell 160 can be made of a thin material. The shell 160 can be made of an elastic material. The bubble 150 can be filled with air, an inert gas, or a non-toxic gas. As will be described below, the bubble 150 can have various shapes. When the bubble 150 is substantially spherical, the bubble 150 can have an associated radius R.

The bubble 150 can be formed in any suitable manner. In one or more arrangements, the bubble 150 can be a void defined by second medium 120. FIGS. 1 and 3C show examples of arrangements in which the bubble 150 is a void defined in the second medium 120 (i.e., water and an elastic material, respectively). FIG. 3B shows an arrangement in which the bubble 150 is defined by a void in the intermediate layer 140 separating the first medium 110 and the second medium 120. In one or more arrangements, the intermediate layer 140 can be an elastic medium. FIG. 3A shows an arrangement in which the bubble 150 is defined by an elastic shell 160 enclosing a space. The elastic shell 160 can be made of a different material than the surrounding medium (e.g., the second medium 120). For example, the bubble 150 can be defined by the elastic shell 160 when the second medium 120 is water. Such a configuration can help to make the bubble 150 more stable in water or other surrounding medium. In some arrangements, a surfactant can be used with the bubble 150 to stabilize the bubble 150 in water or other surrounding medium.

The performance of acoustic impedance matching device 100 can be dependent upon various factors. For example, the distance (t) between the bubble 150 and the interface 130 or the interface-facing portion 112 of the first medium 110 can affect the performance of the bubble 150 as a resonator. The bubble 150 can be located near the interface 130 or near the interface-facing portion 112 of the first medium 110. For example, the bubble 150 can be located within the second medium 120 or within the intermediate layer 140.

In some arrangements, the acoustic impedance matching device 100 can be configured to substantially maintain the bubble 150 at a predetermined distance from the interface 130 or from an interface-facing portion 112 of the first medium 110. By controlling the location of the bubble 150, the resonator characteristics of the bubble 150 can be substantially maintained. Various non-limiting examples of ways in which the bubble 150 can be substantially maintained in an intended position are shown in FIGS. 4A-4C.

Referring to FIG. 4A, the bubble 150 can be substantially maintained in place by one or more wires 170. The wire(s) 170 can be any type of wire, now known or later developed. A first end of the wire(s) 170 can be operatively connected to another portion of the acoustic impedance matching device 100, such as an inner surface 191 of the container 190. In other arrangements, the first end of the wire(s) 170 can be operatively connected to an exterior surface 193 of the container 190. In still other arrangements, the first end of the wire(s) 170 can be operatively connected to some other structure external to the container 190. In such case, the wire(s) 170 can pass through a wall (e.g., side wall 196) of the container 190. A second end of the wire(s) 170 can be operatively connected to the bubble 150, such as by adhesive forces or in any other suitable manner.

FIG. 4B shows another way in which the bubble 150 can be substantially maintained in a desired position. In this example, a spacing layer 180 can be provided between the first medium 110 and the second medium 120. The spacing layer 180 can be an oil layer, an elastic polymer layer, or other suitable type of material layer. The spacing layer 180 can be made of a material that is substantially similar to the second medium 120 with respect to density and/or the speed at which sound travels through the material. As a result, the acoustic impedance of the spacing layer 180 can be similar to that of the second medium 120, thereby minimizing the effect that the presence of the spacing layer 180 has on acoustic signal transmission. The thickness of the spacing layer 180 can determine the distance (t) of the bubble 150 from the interface 130 or from an interface-facing portion 112 of the first medium 110. The bubble 150 can be substantially adjacent to the spacing layer 180. The bubble 150 and/or the spacing layer 180 can be configured such that the bubble 150 does not enter into the spacing layer 180.

Referring to FIG. 4C, the bubble 150 can be substantially maintained in place by one or more threads 175 (and/or one or more wires 170). In this example, the bubble 150 can be defined by the elastic shell 160. The thread(s) 175 can be any suitable type of thread, now known or later developed. A first end of the thread(s) 175 or wire(s) 170 can be operatively connected at or near one end to the container 190, such as an inner surface 191 of the container 190. In other arrangements, the first end of the thread(s) 175 and/or wire(s) 170 can be operatively connected to an exterior surface 193 of the container 190 or to some other structure located outside of the container 190. A second end of the thread(s) 175 and/or wire(s) 170 can be operatively connected to the bubble 150, such as by adhesive forces or in any other suitable manner (e.g., adhesives, fasteners, mechanical engagement, etc.). It will be appreciated that the length of the thread(s) 175 and/or wire(s) 170 can control the distance (t).

The container 190 can be any suitable container for holding the first medium 110 and/or the second medium 120. The first medium 110 and the second medium 120 can be provided in any suitable relative amounts within the container 190. For instance, in some arrangements, the first medium 110 and the second medium 120 can occupy substantially the same volume within the container 190. In other arrangements, the volume of the second medium can be greater than the volume of the first medium. The container 190 can have any suitable, size, shape, and/or configuration. The container 190 can include a top 192, a bottom 194, and/or one or more side walls 196. In one or more arrangements, the top 192 of the container 190 can be open or closed. In one or more arrangements, the bottom 194 of the container 190 can be open or closed. The container 190 can have a width (D), which can be fixed.

In some arrangements, the size, shape, and/or configuration of the container 190 can be used to attain different bubble shapes. FIGS. 2A-2C show various examples of acoustic impedance matching devices 100 with different container 190 and bubble 150 shapes. For instance, in one or more arrangements, the container 190 can be a substantially rectangular container with a substantially square cross-sectional shape, as is shown in FIG. 2A. In such case, the bubble 150 can be substantially spherical. As another example, the container 190 can be substantially cylindrical or tubular, as is shown in FIG. 2C. In such case, the bubble 150 can be substantially oval. As yet another example, the container 190 can be substantially rectangular with a substantially rectangular (but not square) cross-sectional shape, as is shown in FIG. 2B. In such case, the bubble 150 can be substantially cylindrical.

FIG. 5 is an example of an acoustic impedance matching system 200. The acoustic impedance matching system 200 can include a plurality of acoustic impedance matching devices 100. The acoustic impedance matching devices 100 can be arranged and distributed in any suitable manner. FIG. 5 shows an example in which the acoustic impedance matching devices 100 are arranged in an array of substantially aligned rows and columns. The acoustic impedance matching devices 100 can be substantially adjacent to each other. In some arrangements, one or more of the acoustic impedance matching devices 100 can be attached to one or more neighboring acoustic impedance matching devices 100.

In some arrangements, one or more of the acoustic impedance matching devices 100 can be spaced the other acoustic impedance matching devices 100. Alternatively or in addition, one or more of the acoustic impedance matching devices 100 can be offset from the other acoustic impedance matching devices 100. In some arrangements, the acoustic impedance matching devices 100 can be substantially equally spaced from each other. However, in other arrangements, the acoustic impedance matching devices 100 can be unequally spaced from each other. In some arrangements, the acoustic impedance matching devices 100 may not be arranged in rows and columns.

The acoustic impedance matching devices 100 can be substantially identical to each other, or they can be different from each other in one or more respects. Each of the plurality of acoustic impedance matching devices 100 can have an acoustic impedance matching characteristic. In some arrangements, the acoustic impedance matching characteristics of the plurality of acoustic impedance matching devices 100 can be substantially identical. Such arrangements can be useful for facilitating the transmission of an acoustic signal at a particular frequency. Such arrangements can allow a large area to be covered by the system 200.

In other arrangements, the acoustic impedance matching characteristic of at least one of the plurality of acoustic impedance matching devices 100 can be different from the acoustic impedance matching characteristics of the other of the plurality of acoustic impedance matching devices 100. In such case, each acoustic impedance matching device 100 can be configured for a different acoustic signal frequency. Thus, the system 200 can facilitate the transmission of a range of acoustic signal frequencies. The system 200 can be constructed as a broadband impedance matching system.

It should be noted that the acoustic impedance matching devices 100 can facilitate the transmission of acoustic signals in either direction through the devices. Thus, the acoustic impedance matching devices 100 can facilitate the transmission of acoustic signals across the interface 130 when the acoustic signals reach the interface 130 from the first medium 110 side of the interface 130. The acoustic impedance matching devices 100 can also facilitate the transmission of acoustic signals across the interface 130 when the acoustic signals reach the interface 130 from the second medium 120 side of the interface 130.

Figure 6A:
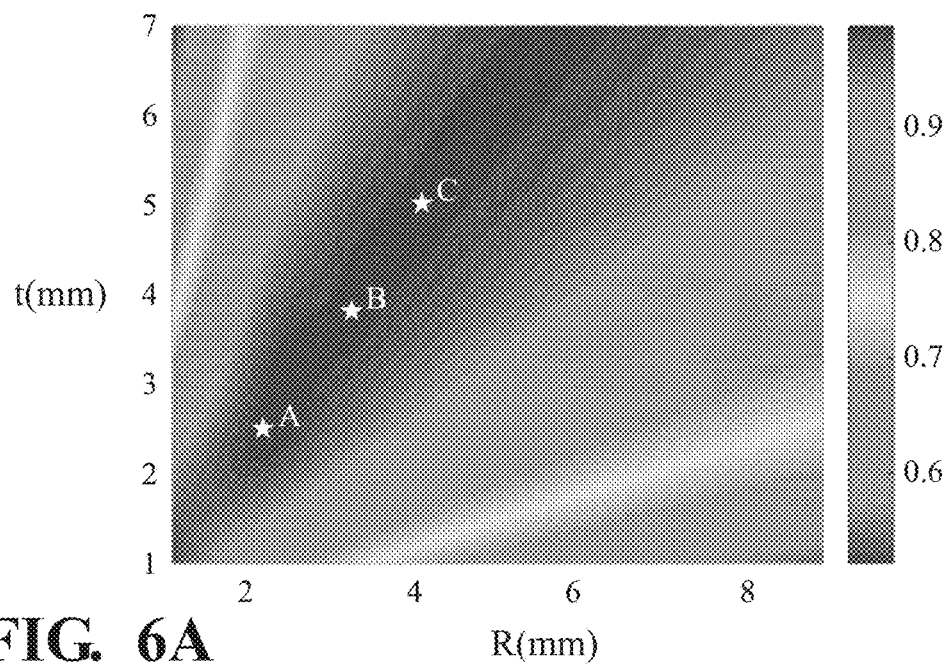
FIG. 6A shows peak sound transmission of one example of an acoustic impedance matching device.
Figure 6B:
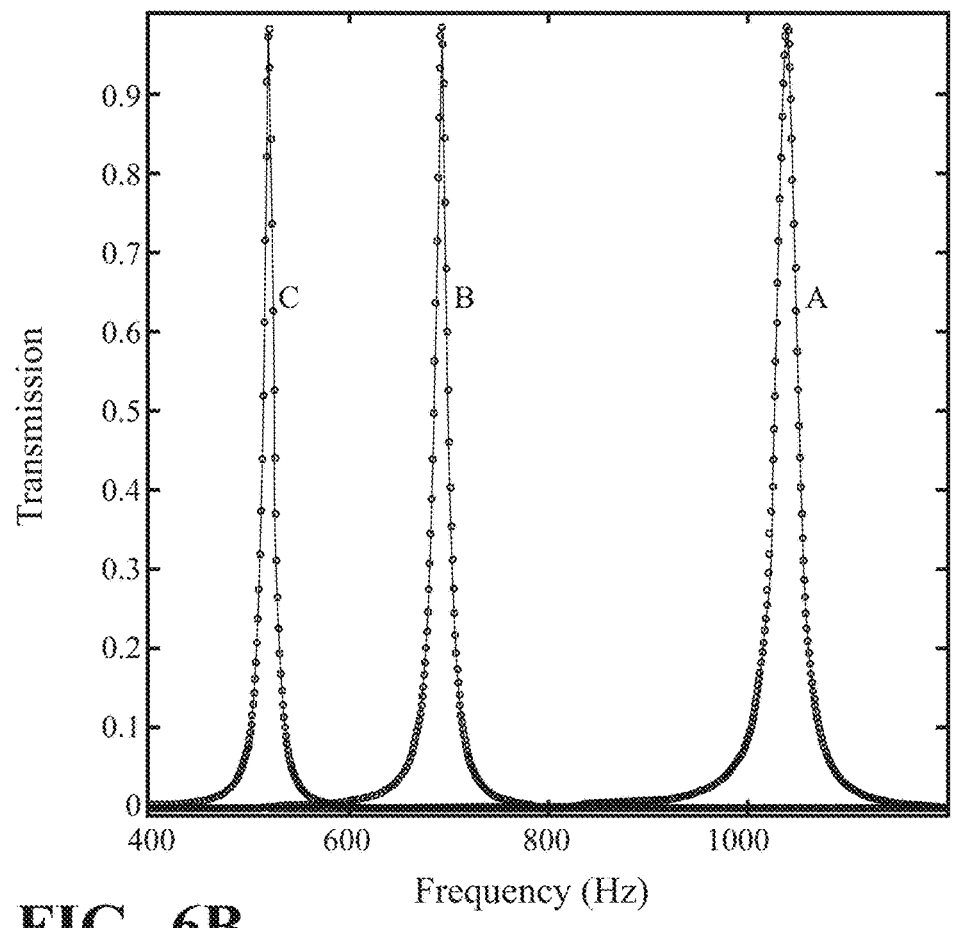
FIG. 6B shows transmission spectra of the bubble resonator at different frequencies.

FIG. 6A shows an example of the acoustic transmission peak of an acoustic impedance matching device. More particularly, FIG. 6A is directed to the acoustic impedance matching device 100 of FIG. 1 for different distances (t) and radii (R) of the bubble 150 with respect to the width (D) of the container 190. The graph includes color regions indicating acoustic transmission percentages. The bar on the right of FIG. 6A is a legend presenting the acoustic transmission percentages for the color regions. Three points—A, B, and C—are marked in FIG. 6A. The radius (R) of the bubble 150 at point can be about 2 mm; the radius (R) of the bubble 150 at point B can be about 3 mm; and the radius (R) of the bubble 150 at point C can be about 4 mm. Each of these points is located within a region corresponding to substantially 100% transmission. FIG. 6B shows acoustic transmission spectra for the three representative points in FIG. 6A. The peak sound transmission reaches 100% at resonance frequency, and it can be tuned by adjusting the thickness (t) and radius (R).

Thus, it will be appreciated that the performance of the acoustic impedance matching devices 100 can be tuned. For instance, the radius (R) of the bubble 150 and the distance (t) between the bubble 150 and the interface 130 can be adjusted to achieve desired performance characteristics of the acoustic impedance matching devices 100. Thus, for a given radius (R), the distance (t) can be selected at the point of peak transmission. Alternatively, for a given distance (t), the radius (R) can be selected at the point of peak transmission.

Figure 7A:
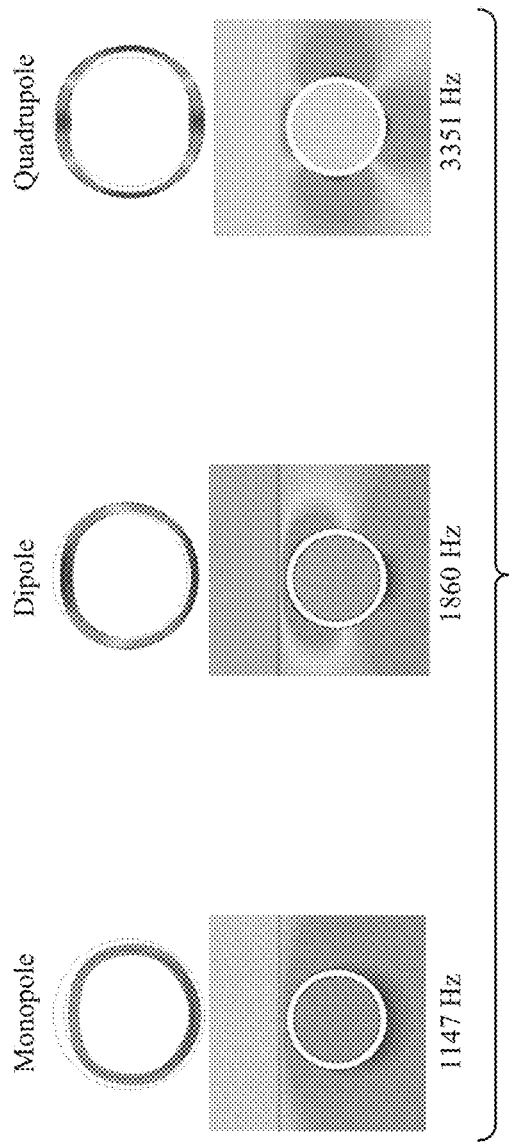
FIG. 7A shows resonances of one example of a bubble resonator at various frequencies.
Figure 7B:
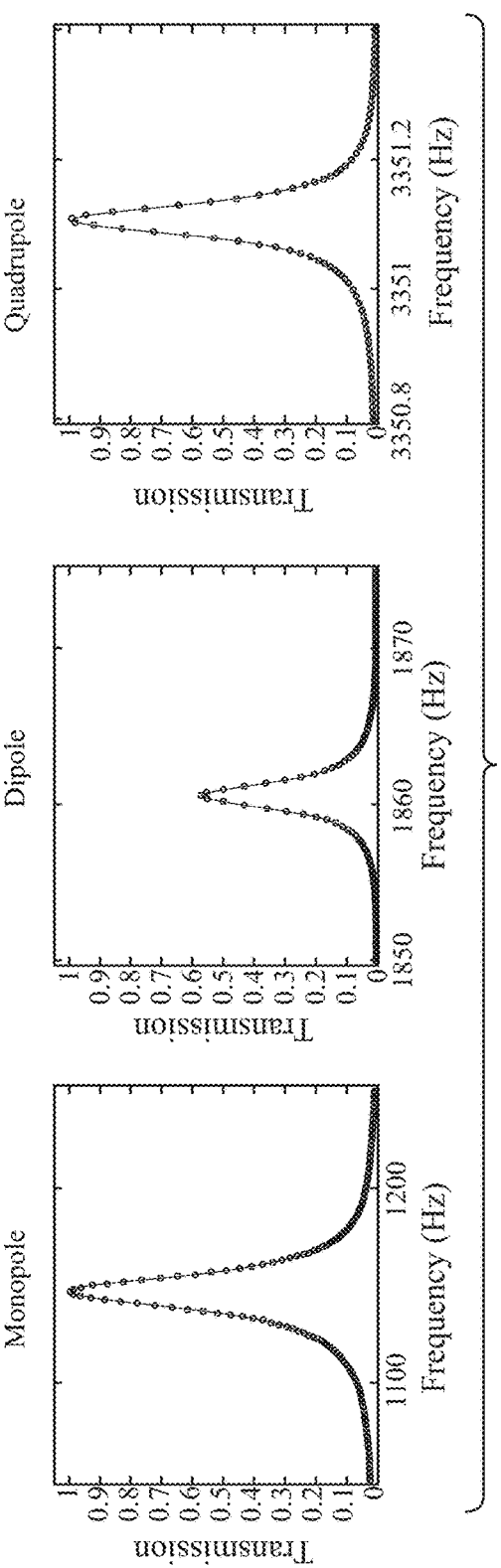
FIG. 7B shows transmission spectra of the bubble resonator at different frequencies.

FIG. 7A shows resonances of one example of an acoustic impedance matching device at various frequencies. In particular, FIG. 7A is directed to an acoustic impedance matching device with a bubble defined by an elastic shell, as is shown in FIG. 3A. Such an acoustic impedance matching device can allow multi-band sound transmission because they enable higher order vibration modes (dipole and quadrupole) at different frequencies.

Arrangements described herein can be used in various settings and in various ways. Some non-limiting examples of the operation of the arrangements described herein will now be presented.

Arrangements described herein can be used in various automotive applications. For instance, arrangements described herein can be used in connection with a fuel tank of a vehicle. Part of the tank can be filled with air, and part of the tank can be filled with gasoline or other fuel. The acoustic impedance between the air and gasoline can be substantially mismatched.

A sonar detector can be operatively positioned with respect to the fuel tank. The sonar detector can include a transmitter to send acoustic signals through the gasoline in the fuel tank. The sonar detector can include a receiver that can receive the acoustic signals that are reflected back after having passed through the gasoline. Based on differences in the transmitted and received acoustic signals, it can be determined whether there are contaminants in the gasoline. Of course, gasoline with such contaminants should not be supplied to the vehicle's engine. A warning can be provided to a vehicle occupant when such contaminants are detected.

However, due to the large acoustic impedance mismatch between the air and gasoline, the acoustic signal will be reflected when it encounters the air-gasoline interface. Consequently, most if not all of the acoustic signals will not pass through the gasoline. Thus, the performance of the sonar detector is adversely affected.

According to arrangements described herein, one or more acoustic impedance matching devices 100 can be provided within the fuel tank. For instance, the acoustic impedance matching device(s) 100 can be floating in the gasoline. In the acoustic impedance matching device(s) 100, the first medium can be air, and the second medium can be gasoline. The bubble can be located within the second medium or in any other location described above. The acoustic impedance matching device(s) 100 can allow the transmitted acoustic signals to cross the air-gasoline interface. The acoustic signals can pass through the gasoline and can be reflected off of a portion of the fuel tank. These reflected acoustic signals can be received by the receiver. It will be appreciated that the sonar detector will acquire useful information about the gasoline. Thus, arrangements described herein can facilitate a sonar-based gasoline quality detection system.

As another example, arrangements described herein can be used in connection with water-related activities. For instance, arrangements described herein can be used in connection with swimming pools. The swimming pool is filled with water, and, of course, there is air located above the pool. As noted above, there is a substantial mismatch between the air and the water.

With some swimming pools, there can be a speaker system that can be operatively positioned above water, such as in competitive swimming events. However, due to the large acoustic impedance mismatch between the air and water, the acoustic signals output by the speakers will be reflected when it encounters the air-water interface. Consequently, the acoustic signals will not pass into the water. Thus, swimmers cannot hear the acoustic signals output by the speakers while underwater. In some instances, underwater speakers can be used so that swimmers can hear the acoustic signals while swimming.

According to arrangements described herein, one or more acoustic impedance matching devices 100 can be provided within the swimming pool. For instance, the acoustic impedance matching device(s) 100 can be floating in the water of the swimming pool. In the acoustic impedance matching device(s) 100, the first medium can be air, and the second medium can be water. The bubble 150 can be located within the water portion of the acoustic impedance matching device(s) 100 or in any other location described above. The acoustic impedance matching device(s) 100 can allow the transmitted acoustic signals to cross the air-water interface and pass into the water, allowing the swimmers to hear the acoustic signals output by an above-water speaker. Thus, in such case, it will be appreciated that underwater speakers would not be needed.

It will be appreciated that arrangements described herein can provide numerous benefits, including one or more of the benefits mentioned herein. For example, arrangements described herein can increase acoustic transmission across an interface between materials with a large acoustic impedance mismatch. In a particular example, arrangements described herein can facilitate efficient sound transmission across a water-to-air interface and/or across a water-to-elastic medium interface. Arrangements described herein can enable tuning of the acoustic transmission across the interface. Arrangements described herein can enable multi-band impedance matching.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language). The term "or" is intended to mean an inclusive "or" rather than an exclusive "or." The phrase "at least one of . . . and . . . " as used herein refers to and encompasses any and all possible combinations of one or more of the associated listed items. As an example, the phrase "at least one of A, B and C" includes A only, B only, C only, or any combination thereof (e.g. AB, AC, BC or ABC). As used herein, the term "substantially" or "about" includes exactly the term it modifies and slight variations therefrom. Thus, the term "substantially parallel" means exactly parallel and slight variations therefrom. "Slight variations therefrom" can include within 15 degrees/percent/units or less, within 14 degrees/percent/units or less, within 13 degrees/percent/units or less, within 12 degrees/percent/units or less, within 11 degrees/percent/units or less, within 10 degrees/percent/units or less, within 9 degrees/percent/units or less, within 8 degrees/percent/units or less, within 7 degrees/percent/units or less, within 6 degrees/percent/units or less, within 5 degrees/percent/units or less, within 4 degrees/percent/units or less, within 3 degrees/percent/units or less, within 2 degrees/percent/units or less, or within 1 degree/percent/unit or less. In some instances, "substantially" can include being within normal manufacturing tolerances.

Aspects herein can be embodied in other forms without departing from the spirit or essential attributes thereof. Accordingly, reference should be made to the following claims, rather than to the foregoing specification, as indicating the scope of the invention.

What is claimed is:

1. An acoustic impedance matching device, comprising:
   a first medium, the first medium having a first acoustic impedance;
   a second medium, the second medium having a second acoustic impedance, the second acoustic impedance being substantially greater than the first acoustic impedance, whereby the first acoustic impedance and the second acoustic impedance are substantially mismatched;

an interface defined between the first medium and the second medium; and a bubble being defined in the second medium or the interface, the first medium and the second medium being located within a container.

2. The device of claim 1, wherein the second acoustic impedance is at least 100 times greater than the first acoustic impedance.

3. The device of claim 1, wherein the first medium is air, and wherein the second medium is one of water or an elastic material.

4. The device of claim 1, wherein the bubble is filled with air or an inert gas.

5. The device of claim 1, wherein the bubble is a void defined in the second medium.

6. The device of claim 1, wherein the bubble is defined by an elastic shell enclosing a space.

7. The device of claim 1, wherein the bubble is substantially spherical.

8. The device of claim 1, wherein the bubble is substantially oval or substantially cylindrical.

9. The device of claim 1, wherein the interface is at least partially defined by an intermediate layer located between the first medium and the second medium, and wherein the bubble is defined by a void in the intermediate layer.

10. The device of claim 9, wherein the intermediate layer is an elastic medium.

11. The device of claim 1, wherein the bubble is substantially maintained at a predetermined distance from an interface-facing portion of the first medium.

12. The device of claim 1, wherein the interface is defined by a region of direct contact between the first medium and the second medium, and wherein the bubble is located in the second medium.

13. An acoustic impedance matching device, comprising:
a first medium, the first medium having a first acoustic impedance;
a second medium, the second medium having a second acoustic impedance, the second acoustic impedance being substantially greater than the first acoustic impedance, whereby the first acoustic impedance and the second acoustic impedance are substantially mismatched;
an interface defined between the first medium and the second medium; and
a bubble being defined in the second medium or the interface,
the bubble being located within the second medium, and the bubble being substantially maintained at a predetermined distance to an interface-facing portion of the first medium by a wire operatively connected to the bubble.

14. An acoustic impedance matching device, comprising:
a first medium, the first medium having a first acoustic impedance;
a second medium, the second medium having a second acoustic impedance, the second acoustic impedance being substantially greater than the first acoustic impedance, whereby the first acoustic impedance and the second acoustic impedance are substantially mismatched;
an interface defined between the first medium and the second medium; and
a bubble being defined in the second medium or the interface,
the bubble being located within the second medium, and the bubble being substantially maintained at a predetermined distance to an interface-facing portion of the first medium by a string operatively connected to the bubble.

15. An acoustic impedance matching device, comprising:
a first medium, the first medium having a first acoustic impedance;
a second medium, the second medium having a second acoustic impedance, the second acoustic impedance being substantially greater than the first acoustic impedance, whereby the first acoustic impedance and the second acoustic impedance are substantially mismatched;
an interface defined between the first medium and the second medium; and
a bubble being defined in the second medium or the interface,
the interface including a spacing layer between the first medium and the second medium, the bubble being located within the second medium, the bubble being substantially maintained at a predetermined distance to an interface-facing portion of the first medium by the spacing layer.

16. The device of claim 15, wherein the spacing layer is made of oil or an elastic material.

17. An acoustic impedance matching system, comprising:
a plurality of acoustic impedance matching devices, each device including:
a first medium, the first medium having a first acoustic impedance;
a second medium, the second medium having a second acoustic impedance, the second acoustic impedance being substantially greater than the first acoustic impedance, whereby the first acoustic impedance and the second acoustic impedance are substantially mismatched;
an interface defined between the first medium and the second medium;
a bubble being defined in the second medium or the interface; and
a housing, the first medium, the second medium, the interface, and the bubble being located within the housing.

18. The system of claim 17, wherein each of the plurality of acoustic impedance matching devices has an acoustic impedance matching characteristic, and wherein the acoustic impedance matching characteristic of the plurality of acoustic impedance matching devices are substantially identical.

19. The system of claim 17, wherein the plurality of acoustic impedance matching devices are arranged in an array of substantially aligned rows and columns.

20. An acoustic impedance matching system, comprising:
a plurality of acoustic impedance matching devices, each device including:
a first medium, the first medium having a first acoustic impedance;
a second medium, the second medium having a second acoustic impedance, the second acoustic impedance being substantially greater than the first acoustic impedance, whereby the first acoustic impedance and the second acoustic impedance are substantially mismatched;

an interface defined between the first medium and the second medium; and a bubble being defined in the second medium or the interface, each of the plurality of acoustic impedance matching devices having an acoustic impedance matching characteristic, and the acoustic impedance matching characteristic of at least one of the plurality of acoustic impedance matching devices being different from the acoustic impedance matching characteristics of the other of the plurality of acoustic impedance matching devices.

* * * * *